United States Patent
Wells et al.

(10) Patent No.: US 6,721,182 B1
(45) Date of Patent: Apr. 13, 2004

(54) CIRCUIT CARD MODULE INCLUDING MEZZANINE CARD HEAT SINK AND RELATED METHODS

(75) Inventors: Robert Grayson Wells, Melbourne Beach, FL (US); Todd David Beak, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/268,812

(22) Filed: Oct. 10, 2002

(51) Int. Cl.[7] .................................................. H05K 7/20
(52) U.S. Cl. ...................... 361/704; 62/259.2; 257/727; 361/715; 361/719; 361/721; 403/409.1
(58) Field of Search ...................... 62/259.2; 211/41.17; 165/80.2–80.3, 185; 174/16.3; 257/726–727, 718–719; 361/704–711, 715, 719–721, 801; 403/409.1

(56) References Cited

U.S. PATENT DOCUMENTS

| | | | |
|---|---|---|---|
| 5,784,263 A | | 7/1998 | Nelson ........................ 361/785 |
| 5,887,435 A | * | 3/1999 | Morton ....................... 62/259.2 |
| 5,892,658 A | | 4/1999 | Urda et al. .................. 361/704 |
| 5,980,275 A | | 11/1999 | Beaman et al. ............... 439/92 |
| 5,984,688 A | | 11/1999 | Norris ......................... 439/64 |
| 5,999,407 A | * | 12/1999 | Meschter et al. ........... 361/704 |
| 6,064,575 A | | 5/2000 | Urda et al. .................. 361/721 |
| 6,104,613 A | | 8/2000 | Urda et al. .................. 361/704 |
| 6,212,075 B1 | | 4/2001 | Habing et al. .............. 361/719 |
| 6,246,582 B1 | | 6/2001 | Habing et al. .............. 361/704 |
| 6,257,328 B1 | | 7/2001 | Fujiwara et al. ............ 165/185 |
| 6,392,891 B1 | | 5/2002 | Tzlil et al. .................. 361/719 |
| 6,538,884 B1 | * | 3/2003 | Wong et al. ................ 361/704 |

OTHER PUBLICATIONS

Conduction Cooled PCI Mezzanine Card (CCPMC) Draft Standard, VITA 20–200x, Draft 1.16, Jul. 2001, VITA Standards Organization, Scottsdale, AZ.
IEEE Standard for a Common Mezzanine Card (CMC) Family, IEEE Std 1386–2001, Jun. 14, 2001, The Institute of Electrical and Electronics Engineers, Inc., New York, New York.

* cited by examiner

Primary Examiner—Gregory D. Thompson
(74) Attorney, Agent, or Firm—Allen, Dyer, Doppelt, Milbrath & Gilchrist, P.A.

(57) ABSTRACT

A circuit card module to be received in a card chassis includes a host card assembly and a mezzanine card assembly carried in spaced relation by the host card assembly. The host card assembly includes a host card heat sink having an end to connect to the card chassis to conduct heat thereto, and a host circuit card mounted on the host card heat sink. The mezzanine card assembly includes a mezzanine card heat sink, and a mezzanine circuit card mounted on the mezzanine card heat sink. The mezzanine card heat sink has an end to connect to the card chassis to conduct heat thereto in parallel with heat conducted from the host card heat sink to the card chassis. The mezzanine card heat sink may comprise a body adjacent the mezzanine circuit card, and a flexible strap extending outwardly therefrom to connect to the card chassis.

44 Claims, 5 Drawing Sheets

CIRCUIT CARD MODULE INCLUDING MEZZANINE CARD HEAT SINK AND RELATED METHODS

FIELD OF THE INVENTION

The present invention relates to the field of electronic circuits, and, more particularly, to circuit cards.

BACKGROUND OF THE INVENTION

The electronic components of computers and other modern electronic devices are frequently mounted on a printed wiring board (PWB). The PWB and electronic components mounted thereon define a circuit card that can be inserted into a chassis and electronically coupled to a backplane of the electronic device. One circuit card may serve as a host card to another circuit card electrically and physically connected thereto. The circuit card connected to the host circuit card is typically carried in piggyback fashion above and parallel to the host circuit card and is conventionally referred to as a mezzanine circuit card.

Commercial off-the-shelf mezzanine circuit cards are increasingly used for a variety of functions. A peripheral component interconnect (PCI) mezzanine card, for example, provides an efficient network interface allowing multiple computers and/or other electronic devices to electronically communicate and exchange data with one another. A particular example of such a mezzanine card is a fiber channel (FC) network interface card (NIC) that is mounted to a host card that can be used, for example, in the avionics field.

As with electronic devices generally, operation of a circuit card can generate heat that, if not adequately controlled through some cooling mechanism, may cause damage to the electronic components carried on the circuit cards. One approach has been to use convection cooling techniques and devices. With convection cooling, the circuit cards may be mounted to a chassis in a way that permits cooling air to flow over the circuit cards.

For proper convection cooling, an adequate flow of cooling air should be generated. This may be done, for example, using a fan encased in the electronic device. The circuit cards, moreover, should be arranged so that a sufficient amount of the circuit card's surface area is exposed to the cooling air, and so that the cooling air flows relatively freely within the electronic device. Such arrangements may be incompatible, however, with some uses of circuit cards where electronic devices typically need to be quite small in size. Accordingly, there may not be space in such devices for a fan or to arrange the circuit cards so that air flows freely over them.

Accordingly, there is increasing demand for mezzanine and other circuit cards that can be conduction cooled. This increased demand is evinced, for example, by the Conduction Cooled PCI Mezzanine Card (CCPMC) Draft Standard VITA 20-200x (Draft 1.16) released in July of 2001 by the VITA Standards Organization. There is also a need to make conduction cooling more effective so that circuit cards can be used in environments subject to extreme temperature ranges, such as for military applications and in avionics.

U.S. Pat. No. 6,212,075 to Habing et al. discloses a kit for adapting circuit cards to increase their cooling efficiency while allowing them to remain compliant with IEEE 1101.2 specifications. The kit includes an extended width wedgelock that connects a frame to the cold wall of a card chassis. The frame, in turn, connects to a base card and a mezzanine card carried thereon. Heat is transferred via the frame from the cards and from a component-mounted thermal heat sink to the cold wall. The wedgelock has an extended width so as to increase the surface area contact between the frame and the cold wall.

With conventional conduction cooling techniques and devices for host and mezzanine circuit cards, heat is conducted from both the host circuit card and the mezzanine circuit card carried thereon to a single heat sink. Thus heat is conducted additively from both circuit cards to the single heat sink, which, in turn, may connect to the cold wall of the chassis to conduct the combined heat in serial fashion to the cold wall.

Attempts to provide better cooling of circuit card devices have not been wholly satisfactory. For example, thermoelectric cooling may require a relatively large amount of power, while another technique—that of conducting heat via heatpipes—does do not appear suited for robust environments such as those associated with military avionics. Moreover, standards such as the Conduction Cooled PCI Mezzanine Card (CCPMC) Draft Standard may be difficult to conform to using such conventional approaches.

SUMMARY OF THE INVENTION

Figure 1:
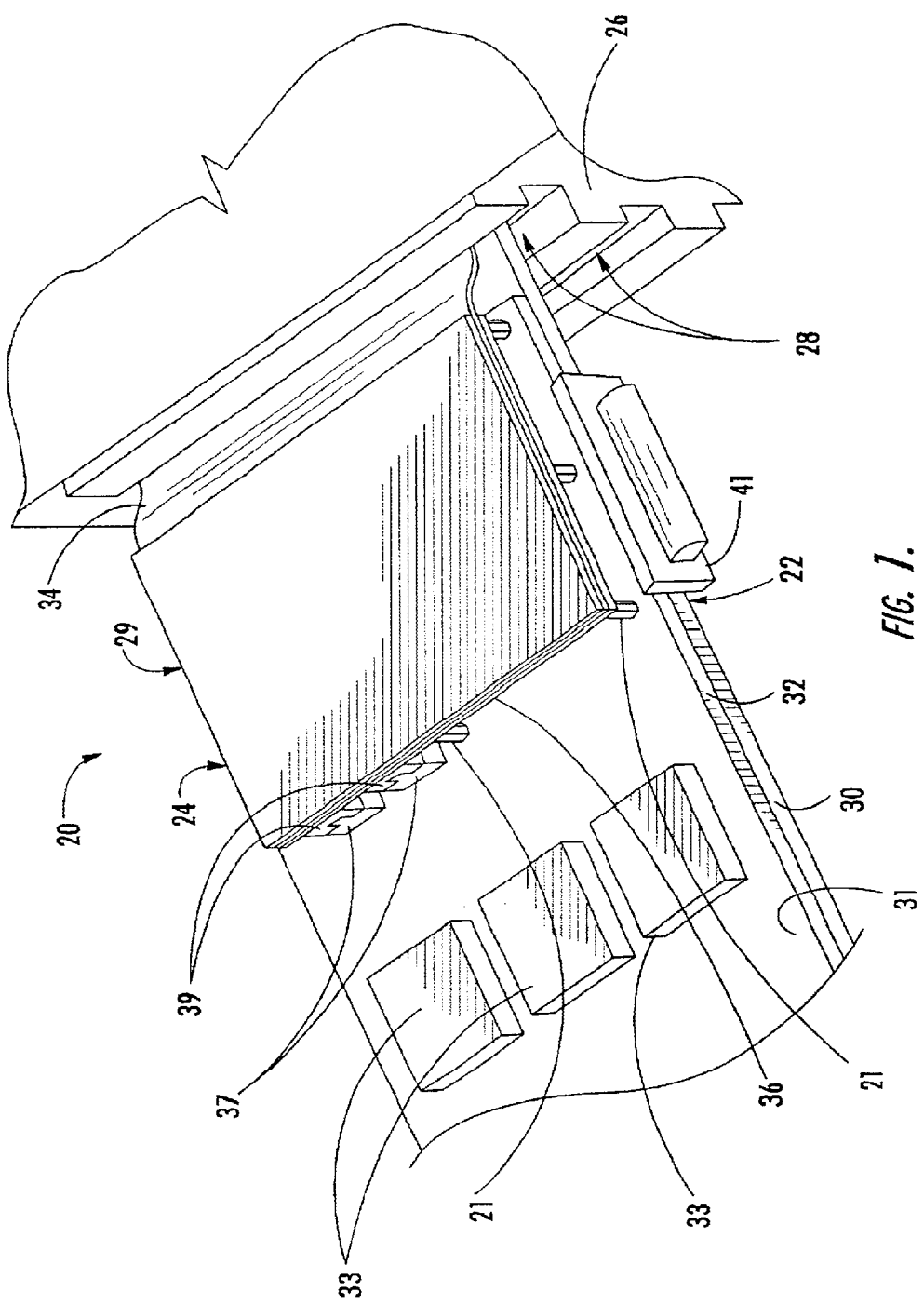
FIG. 1 is a perspective view of a circuit card module and chassis portion according to the present invention.

In view of the foregoing background, it is therefore an object of the present invention to provide a more efficiently cooled circuit card module.

This and other objects, features, and advantages in accordance with the present invention are provided by a circuit card module that includes both a host card assembly and a mezzanine card assembly carried thereon, both the assemblies having respective heat sinks that may conduct heat in parallel to a card chassis. The parallel heat conduction contrasts sharply with conventional cooling techniques and devices in which heat is transferred to a common heat sink and then conducted to the card chassis. Instead, the heat paths from the respective assemblies in accordance with the invention are decoupled so that the conduction of each of the respective heat sinks is more thermally efficient. The enhanced thermal efficiency is achieved easily and without having to reduce the number or power of heat dissipating electrical components that may be carried on the respective card assemblies.

The host card assembly of the circuit card module may include a host card heat sink, which has an end that connects to the card chassis to conduct heat thereto. The host card assembly also may include a host circuit card mounted on the host card heat sink.

The mezzanine card assembly may be carried on the host card assembly in a spaced relation therefrom. The mezzanine card assembly may include a mezzanine card heat sink, which has an end that connects to the card chassis to conduct heat thereto in parallel with heat conducted from the host card heat sink to the card chassis. The mezzanine card assembly also may include a mezzanine circuit card connected to the mezzanine card heat sink.

The mezzanine card heat sink may comprise a body adjacent the mezzanine circuit card, and a flexible strap extending outwardly from the body and connecting to the card chassis. The body and flexible strap may be integrally formed as a monolithic unit. The body, moreover, can be formed or reinforced to provide added rigidity to the mezzanine card assembly for use in harsh dynamic environments. The mezzanine card heat sink may comprise a material having a relatively high thermal conductivity, such as copper or aluminum. An end of the mezzanine card heat sink may connect to an end of the host card heat sink at the card chassis. The flexibility of the strap aids in installation.

The host card assembly may comprise a card retainer for connecting to the card chassis. The card retainer may overlie the ends of the mezzanine card heat sink and the host card heat sink where they connect at the card chassis. Alternately, the card retainer may overlie the end of the mezzanine card heat sink and an end of a heat sink of a host card assembly different than the one on which the mezzanine card assembly is mounted, the card retainer overlying the respective ends where they connect at the card chassis.

In other embodiments, the ends of the host card heat sink and mezzanine card heat sink may connect to the card chassis in a spaced relation from one another. The host card assembly and the mezzanine card assembly, accordingly, may each comprise a card retainer for connecting to the card chassis.

The host card heat sink and mezzanine card heat sink also may each include respective mating electrical connector portions. The mezzanine card assembly further may include a plurality of support posts that extend outwardly to engage the host card assembly.

The host circuit card may have a host substrate on which a plurality of electronic components may be carried, and the mezzanine circuit card may have a mezzanine substrate on which a plurality of electronic components may be carried. The plurality of electronic components may be carried on the mezzanine substrate so that they face the electronic components of said host circuit card.

The mezzanine circuit card may comprise a peripheral component interface (PCI) card. Additionally, the mezzanine card assembly may be configured to conform to at least one of the IEEE Standard for a Common Mezzanine Card (CMC) Family and the Conduction Cooled PCI Mezzanine Card (CCPMC) Draft Standard, VITA 20-200x.

An additional aspect of the invention relates to a method for conduction cooling of a mezzanine circuit card assembly. The method may include mounting the mezzanine circuit card assembly to a host circuit card assembly in spaced relation therefrom, wherein the mezzanine card assembly includes a mezzanine card heat sink and a mezzanine circuit card connected to the mezzanine card heat sink, and wherein the mezzanine card heat sink, in turn, includes a body adjacent a strap extending outwardly from the body. The method also may include connecting the strap of the mezzanine card heat sink to a card chassis receiving the host circuit card assembly.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments.

Figure 2:
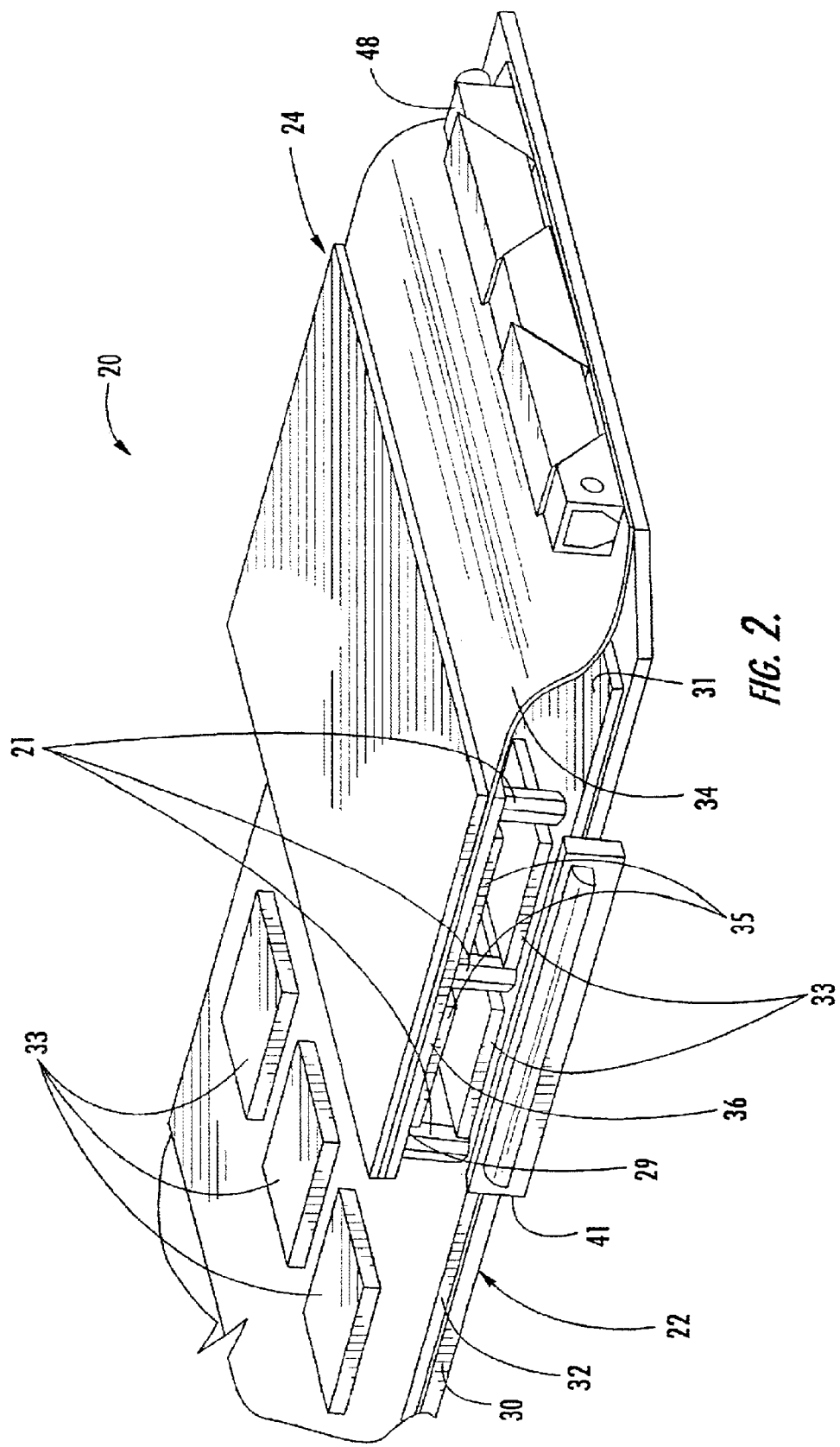
FIG. 2 is another perspective view of the circuit card module in FIG. 1.

Referring initially to FIGS. 1 and 2, a circuit card module 20 according to the present invention is described. The circuit card module 20 illustratively includes a host card assembly 22 and a mezzanine card assembly 24, the mezzanine card assembly being carried by the host card assembly in a spaced relation therefrom. The circuit card module 20 is received in a circuit card chassis 26 that illustratively includes a plurality of slots 28, at least one of which may receive the circuit card module 20 as shown.

The host card assembly 22 illustratively includes a host card heat sink 30, which has an end that connects to the card chassis 26 to conduct heat thereto. The host card assembly 22 also illustratively includes a host circuit card 32 mounted on the host card heat sink 30. The host circuit card 32 illustratively comprises a host substrate 31 that carries a plurality of electronic components 33. The host circuit card 32 is illustratively mounted on the host card heat sink 30.

The mezzanine card assembly 24 illustratively includes a mezzanine card heat sink 34 that has an end that connects to the card chassis 26 to conduct heat thereto. The heat is conducted by the mezzanine card heat sink 34 in parallel with heat conducted from the host card heat sink 30 to the card chassis. The mezzanine card assembly 24 also illustratively includes a mezzanine circuit card 36 connected to the mezzanine card heat sink 34. The mezzanine circuit card 36 illustratively includes a mezzanine substrate 29 on which a plurality of electronic components 35 is carried. Support posts 21 illustratively extend outwardly from the mezzanine card assembly 24 to engage the host card assembly 22 with the mezzanine card assembly in a spaced relation thereto.

The host card assembly 22 and the mezzanine card assembly 24 illustratively include respective mating electrical connector portions 37, 39. The electrical connector portions 37, 39 serve to electrically link the electrical components 33, 35 carried respectively by the host substrate 31 and mezzanine substrate 29. Additionally, an electrical connector 41 illustratively connects to the host circuit card 32 to electrically connect the circuit card module 20 to a backplane (not shown) of a computer or electronic device as will also be readily understood by those skilled in the art.

As will be readily understood by those skilled in the art, the mezzanine card heat sink 34 conducts heat generated by the electrical components 35 carried on the mezzanine substrate 29. Because the mezzanine card heat sink 34 conducts the heat to the card chassis 26 rather than directly to the host card heat sink 30, the heat is conducted in parallel rather than being added to the host card heat sink 30, which conducts heat generated by the electrical components 33 carried by the host substrate 31. Parallel conduction lessens the amount of heat that must be conducted by the host card heat sink 30 and accordingly enhances the thermal conduction of both the host card heat sink 30 and the mezzanine card heat sink 34.

Figure 3:
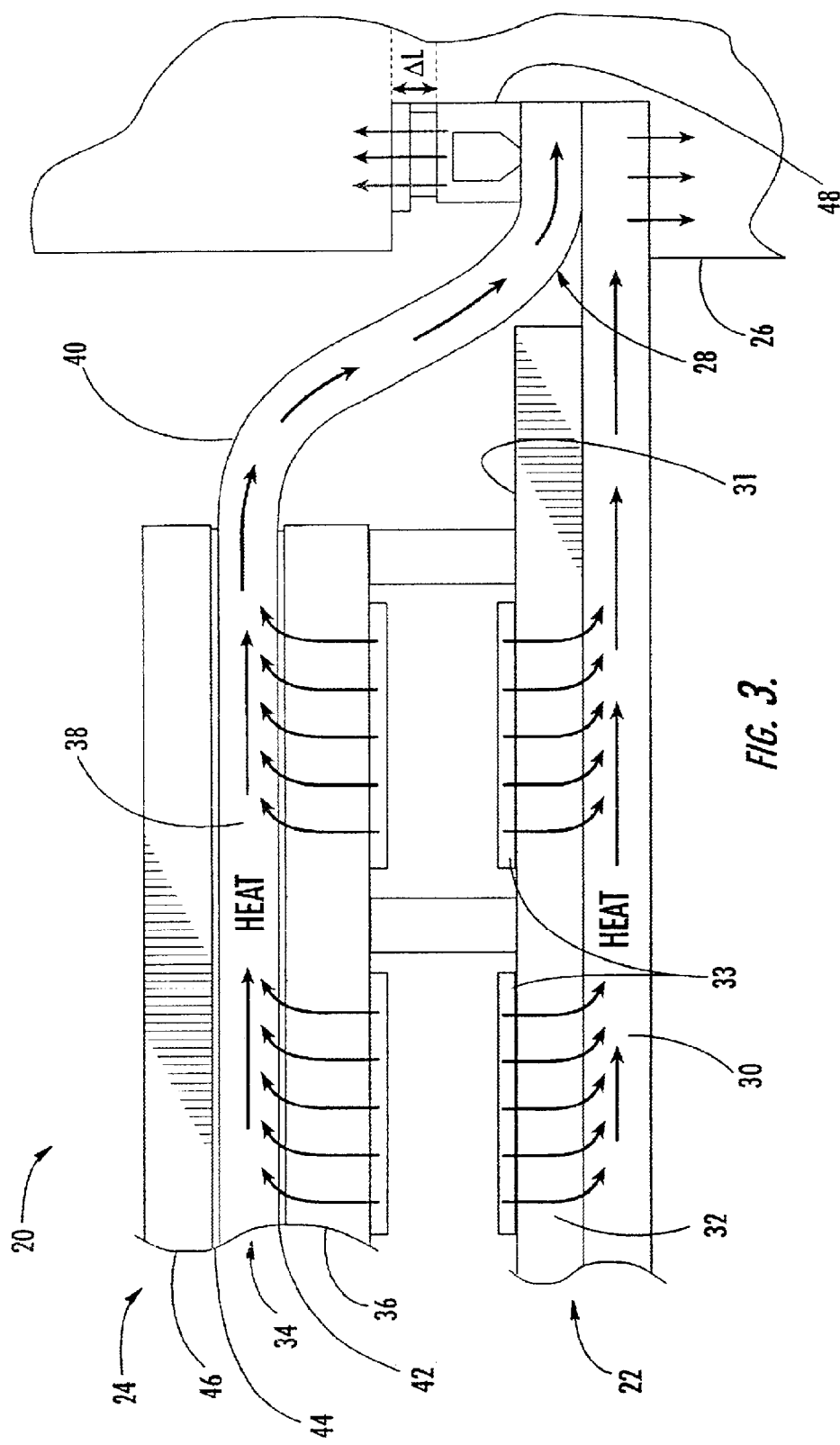
FIG. 3 is a greatly enlarged side elevation view of the circuit card module and chassis in FIG. 1.

Referring additionally now to FIG. 3, the mezzanine card heat sink 34 illustratively comprises a body 38 adjacent the mezzanine circuit card 36, and a strap 40 that extends outwardly from the body to connect to the card chassis 26.

The body 38 and the strap 40 may be integrally formed as a monolithic unit. One skilled in the art will readily appreciate, however, that the body 38 and the strap 40 may alternately comprise discrete, non-integrally formed elements that are in thermal communication with one another.

The strap 40 is illustratively flexible. One skilled in the art will appreciate from the ensuing description, however, that a relatively rigid strap may be adequate in some arrangements for conducting heat from the mezzanine circuit card 36 to the card chassis 26 in parallel with heat connected thereto by the host card heat sink 30. Flexibility of the strap 40, though, provides a number of distinct advantages. For example, the connection of the strip 40 to the card chassis 26 is more easily made if the strap 40 is flexible. Flexibility can also accommodate tolerance buildup through the mezzanine and host circuit card assemblies 24, 22 as will be readily understood by those skilled in the art.

To efficiently conduct heat, the mezzanine card heat sink 34 may comprise a material that has a high thermal conductivity as will be readily understood by those skilled in the art. For example, the mezzanine card heat sink 34 may comprise copper. Accordingly, as illustrated, the body 38 and strap 40 comprise a thin strip of 30 mil copper thermal flex that extends outwardly from the mezzanine circuit card 36. As will be readily understood by those skilled in the art, other thermally conductive materials of different thickness may alternately be used in accordance with the particular application and environment.

Further by way of illustration, a first 15 mil thermally conductive adhesive layer 42 connects the body 38 of the mezzanine card heat sink 34 to a surface of the mezzanine circuit card opposite the surface on which electrical components may be carried, and a second 15 mil thermally conductive adhesive layer 44 illustratively connects a rigid layer 46 (e.g., aluminum) to the body 38 of the heat sink. The illustrated construction provides particular advantages in, for example, a robust environment such as ones associated with military avionics, but, again, as will be readily appreciated by those skilled in the art, layers of different thickness may alternately be used. Those skilled in the art will further appreciate that the mezzanine heat sink 34 and the mezzanine circuit card 36 may be thermally connected using other techniques and/or devices as well.

Similarly, while the rigid layer 46 provides added structural integrity, the rigid layer 46 need not be included depending on the particular application and use environment. Moreover, although the mezzanine card heat sink 34 is illustratively mounted above the mezzanine circuit card 36, it will be readily appreciated by those skilled in the art that alternately the mezzanine card heat sink 34 may instead be laminated within the mezzanine circuit card. This can be accomplished, for example, with a mezzanine circuit card 36 that comprises a standard wiring board and by using rigid flex construction techniques known to those skilled in the art.

The strap 40 and the host card heat sink 30 illustratively connect together at a point where they also connect to the card chassis 26, within a slot 28 of the card chassis. As illustrated, a card retainer 48 overlies the ends of the mezzanine card heat sink 34 and the host card heat sink 30. The card retainer 48 as further illustrated is expandable, so that that it can be expanded vertically by a desired amount AL within the slot 28 of the card chassis 26. The card retainer 48 accordingly serves to more securely connect the mezzanine card heat sink 34 and the host card heat sink 30 to the card chassis 26. The card retainer 48 also conducts heat flow (indicated by the direction of the flow arrows in FIG. 3) from the mezzanine card heat sink 34 to the card chassis 26, which further enhances the thermal efficiency of the circuit card module 20.

Figure 4:
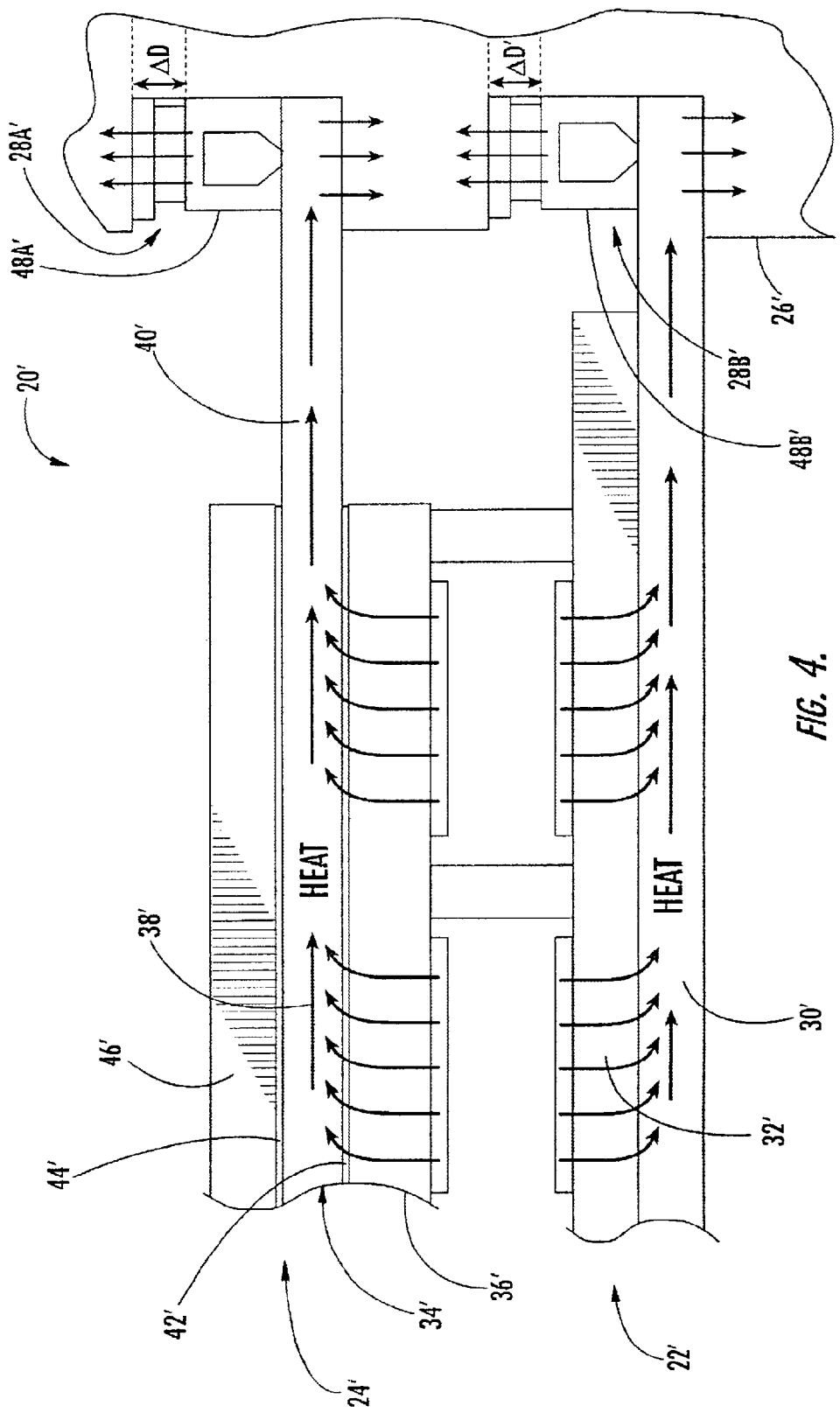
FIG. 4 is a greatly enlarged side elevation view of another embodiment of the circuit card module and chassis in FIG. 1.

In an alternate embodiment of the circuit card module 20' illustrated in FIG. 4, the strap 40' of the mezzanine card heat sink 34' connects to the card chassis 26' in a spaced relation from the host card heat sink 30'. The mezzanine card heat sink 34' and the host card heat sink 30' accordingly connect to the card chassis 26' in respective slots 28A', 28B' of the card chassis.

Respective card retainers 48A', 48B' illustratively overlie respective ends of each of the mezzanine card heat sink 34' and the host card heat sink 30'. Illustratively, the respective card retainers 48A', 48B' adjustably expand vertically by a desired amounts ΔD, ΔD' to force the respective ends more tightly against the card chassis 26'. Again, this improves the thermal connection of the host card and mezzanine card heat sinks 30', 34' to the card chassis 26', thereby further enhancing their thermal conduction.

Figure 5:
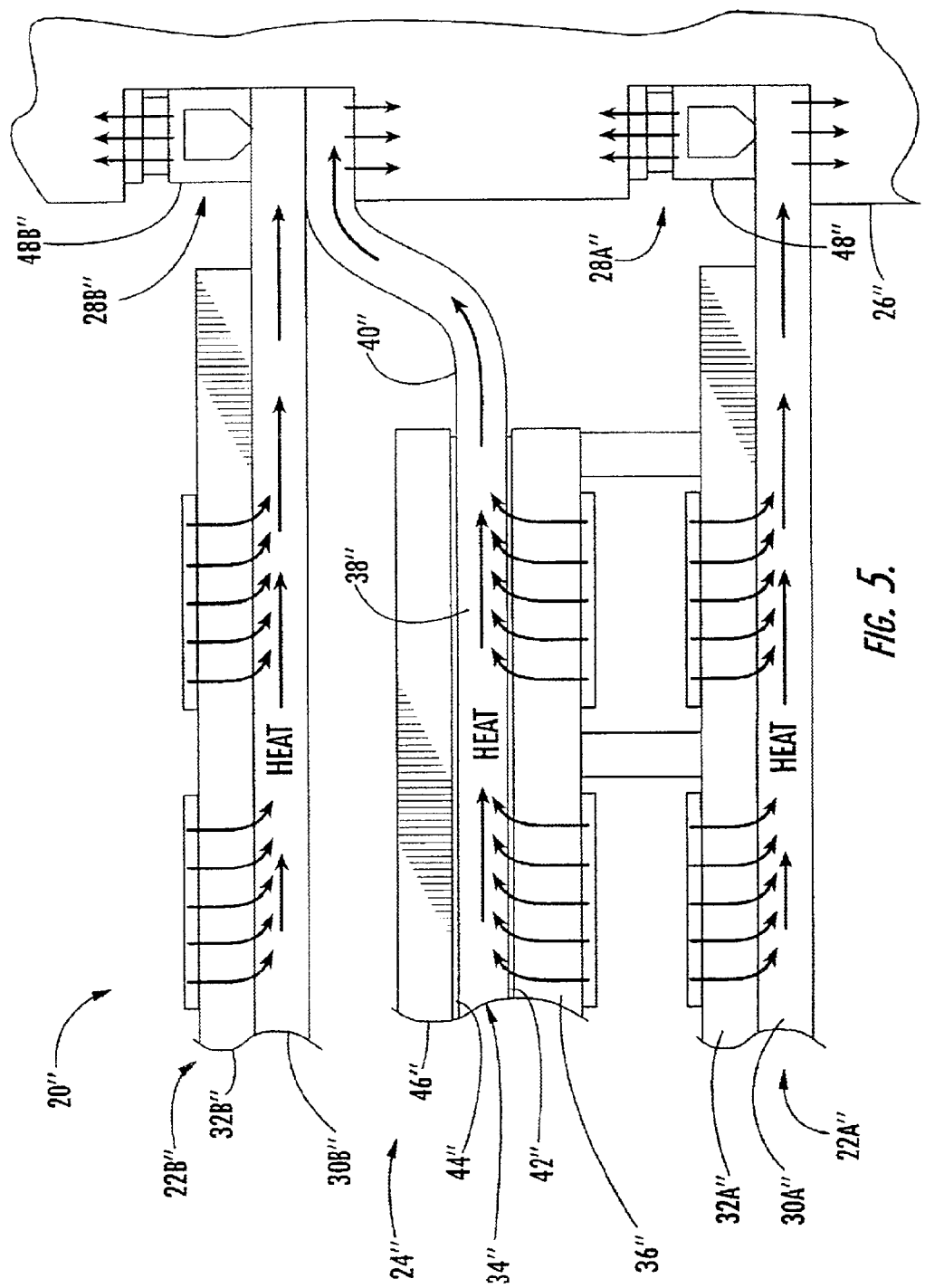
FIG. 5 is a greatly enlarged side elevation view of yet another embodiment of the circuit card module and chassis in FIG. 1.

In another embodiment illustrated in FIG. 5, the strap 40" of the mezzanine card heat sink 34" connects to the card chassis 26" in a spaced relation from the host card heat sink 30A" of the host card assembly 22" on which the mezzanine card assembly 24" is mounted. As shown, an end of the strap 40" connects to the end of a host card heat sink 30B" of a second host card assembly 22B", the ends connecting to the card chassis 26" in a slot 28B" of the card chassis.

Aside from the cooling efficiency provided by conducting heat via the mezzanine card heat sink 34 in parallel with heat conducted from the host card heat sink 30 to the card chassis 26, the circuit card module 20 provides other advantages. Among these is the fact that the parallel heat conduction can be achieved without having to reduce the number or power of heat dissipating electrical components that may be carried upon the substrates of either the host circuit card 32 or the mezzanine circuit card 36. Yet a further advantage is that, because the mezzanine card heat sink 34 may comprise a flexible strap 40 for connecting to the card chassis 26, the circuit card module 20 may be more easily connected along with the host card assembly 22 at the card chassis 26.

Another distinct advantage is that the circuit card module 20, 20', 20" may be made to conform to various standards as well as made for custom applications in different environments. For example, the mezzanine card assembly 24, 24', 24" may be made to mount to different types of host cards, including those conforming to the IEEE-1101 family of standards. The mezzanine card assembly 24, 24', 24" also may be made to mount to non-standard host cards that include a mezzanine card interface conforming to the Common Mezzanine Card (CMC) IEEE 1386 standards and extensions such as the 1386.1 and P1386.2 extensions. Likewise, the mezzanine card assembly 24, 24', 24" may be made to mount to non-standard host cards that include a mezzanine card interface conforming to the Conduction Cooled PCI Mezzanine Card (CCPMC) VITA 20-200X standard. Accordingly, the mezzanine circuit card 24, 24', 24" may comprise, for example, a peripheral component interface (PCI) that conforms to at least one these standards.

More generally, the mezzanine card assembly 24 may be made to fit other host applications. Accordingly, the mezzanine card assembly 24 may advantageously have different sizes. Likewise, the mezzanine card heat sink 34 connected to the mezzanine circuit card 36 may have different constructions. For example, the mezzanine card heat sink 34 may comprise more than one flexible strap. Each of the flexible straps, moreover, may extend outwardly in a different direction. The mezzanine heat sink 34, moreover, may mount differently to a thermal interface (e.g., card chassis 26 or cold rail). For example, the mezzanine heat sink 34 may be bolted to the thermal interface. Alternately the mezzanine heat sink 34 may be bonded to the thermal interface.

An additional aspect of the present invention relates to a method for conduction cooling of a mezzanine circuit card assembly 24. The method includes mounting the mezzanine circuit card assembly 24 to a host circuit card assembly 22 in spaced relation therefrom, the mezzanine card assembly comprising a mezzanine card heat sink 34 and a mezzanine circuit card 36 connected to the mezzanine card heat sink, and the mezzanine card heat sink comprising a body 38 adjacent the mezzanine circuit card and a strap 40 extending outwardly from the body. The method also includes connecting the strap 40 of the mezzanine card heat sink 34 to a card chassis 26 that receives the host circuit card assembly 22, which includes a host card heat sink 30.

The method illustratively further includes connecting the end of the host card heat sink 30 to the card chassis 26 together with the end of the strap 40 of the mezzanine card heat sink 34. Alternately, the method entails connecting the end of the host card heat sink 301 to the card chassis 26' in spaced relation from the end of the strap 40' of the mezzanine card heat sink 34'.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. A circuit card module to be received in a card chassis, the circuit card module comprising:
   a host card assembly comprising
      a host card heat sink having an end to connect to the card chassis to conduct heat thereto, and
      a host circuit card mounted on said host card heat sink; and
   a mezzanine card assembly carried by said host card assembly in spaced relation therefrom and comprising
      a mezzanine card heat sink having an end to connect to the card chassis to conduct heat thereto and in parallel with heat conducted from said host card heat sink to the card chassis, and
      a mezzanine circuit card connected to said mezzanine card heat sink.

2. A circuit card module according to claim 1 wherein said mezzanine card heat sink comprises a body adjacent said mezzanine circuit card, and a flexible strap extending outwardly from said body to connect to the card chassis.

3. A circuit card module according to claim 2 wherein said body and said flexible strap are integrally formed as a monolithic unit.

4. A circuit card module according to claim 1 wherein said mezzanine card heat sink comprises copper.

5. A circuit card module according to claim 1 wherein the ends of said host card heat sink and mezzanine card heat sink are to be connected together at the card chassis.

6. A circuit card module according to claim 1 wherein said host card assembly further comprises a card retainer for connecting to the card chassis.

7. A circuit card module according to claim 6 wherein said card retainer overlies the ends of said mezzanine card heat sink and said host card heat sink.

8. A circuit card module according to claim 1 wherein the ends of said host card heat sink and mezzanine card heat sink are to be connected in spaced relation at the card chassis.

9. A circuit card module according to claim 1 wherein said host card assembly and said mezzanine card assembly each comprises respective mating electrical connector portions.

10. A circuit card module according to claim 1 wherein said mezzanine card assembly further comprises a plurality of support posts extending outwardly to engage said host card assembly.

11. A circuit card module according to claim 1 wherein said host circuit card comprises a host substrate and a plurality of electronic components carried thereby; and wherein said mezzanine circuit card comprises a mezzanine substrate and a plurality of electronic components carried thereby and facing the electronic components of said host circuit card.

12. A circuit card module according to claim 1 wherein said mezzanine circuit card comprises a peripheral component interface (PCI) card.

13. A circuit card module according to claim 1 wherein said mezzanine card assembly is configured to conform to at least one of the IEEE Standard for a Common Mezzanine Card (CMC) Family and the Conduction Cooled PCI Mezzanine Card (CCPMC) Draft Standard, VITA 20-200x standards.

14. A circuit card module to be received in a card chassis, the circuit card module comprising:
   a host card assembly comprising
      a host card heat sink having an end to connect to the card chassis to conduct heat thereto, and
      a host circuit card mounted on said host card heat sink; and
   a mezzanine card assembly carried by said host card assembly in spaced relation therefrom and comprising
      a mezzanine card heat sink having an end to connect to the card chassis to conduct heat thereto and in parallel with heat conducted from said host card heat sink to the card chassis, and
      a mezzanine circuit card connected to said mezzanine card heat sink,
      said mezzanine card heat sink comprising a body adjacent said mezzanine circuit card, and a flexible strap extending outwardly from said body to connect to the card chassis;
   the ends of said host card heat sink and mezzanine card heat sink to be connected together at the card chassis.

15. A circuit card module according to claim 14 wherein said body and said flexible strap are integrally formed as a monolithic unit.

16. A circuit card module according to claim 14 wherein said mezzanine card heat sink comprises copper.

17. A circuit card module according to claim 14 wherein said host card assembly further comprises a card retainer for connecting to the card chassis; and wherein said card retainer overlies the ends of said mezzanine card heat sink and said host card heat sink.

18. A circuit card module according to claim 14 wherein said host card assembly and said mezzanine card assembly each comprises respective mating electrical connector portions.

19. A circuit card module according to claim 14 wherein said mezzanine card assembly further comprises a plurality of support posts extending outwardly to engage said host card assembly.

20. A circuit card module according to claim 14 wherein said host circuit card comprises a host substrate and a plurality of electronic components carried thereby; and wherein said mezzanine circuit card comprises a mezzanine substrate and a plurality of electronic components carried thereby and facing the electronic components of said host circuit card.

21. A circuit card module according to claim 14 wherein said mezzanine circuit card comprises a peripheral component interface (PCI) card.

22. A circuit card module according to claim 14 wherein said mezzanine card assembly is configured to conform to at least one the IEEE Standard for a Common Mezzanine Card (CMC) Family and the Conduction Cooled PCI Mezzanine Card (CCPMC) Draft Standard, VITA 20-200x standards.

23. A circuit card module to be received in a card chassis, the circuit card module comprising:
  a host card assembly comprising a host circuit card; and
  a mezzanine card assembly carried by said host card assembly in spaced relation therefrom and comprising
    a mezzanine card heat sink, and
    a mezzanine circuit card connected to said mezzanine card heat sink,
    said mezzanine card heat sink comprising a body adjacent said mezzanine circuit card, and a flexible strap extending outwardly from said body and having an end to connect to the card chassis to conduct heat thereto.

24. A circuit card module according to claim 23 wherein said body and said flexible strap are integrally formed as a monolithic unit.

25. A circuit card module according to claim 23 wherein said mezzanine card heat sink comprises copper.

26. A circuit card module according to claim 23 wherein said host card assembly and said mezzanine card assembly each comprises respective mating electrical connector portions.

27. A circuit card module according to claim 23 wherein said mezzanine card assembly further comprises a plurality of support posts extending outwardly to engage said host card assembly.

28. A circuit card module according to claim 23 wherein said host circuit card comprises a host substrate and a plurality of electronic components carried thereby; and wherein said mezzanine circuit card comprises a mezzanine substrate and a plurality of electronic components carried thereby and facing the electronic components of said host circuit card.

29. A circuit card module according to claim 23 wherein said mezzanine circuit card comprises a peripheral component interface (PCI) card.

30. A circuit card module according to claim 23 wherein said mezzanine card assembly is configured to conform to at least one of the IEEE Standard for a Common Mezzanine Card (CMC) Family and the Conduction Cooled PCI Mezzanine Card (CCPMC) Draft Standard, VITA 20-200x standards.

31. A mezzanine card assembly to be carried by a host card assembly in spaced relation therefrom and to conduct heat to a card chassis receiving the host card assembly, the mezzanine card assembly comprising:
  a mezzanine card heat sink; and
  a mezzanine circuit card connected to said mezzanine card heat sink;
  said mezzanine card heat sink comprising a body adjacent said mezzanine circuit card, and a flexible strap extending outwardly from said body and having an end to connect to the card chassis to conduct heat thereto.

32. A mezzanine card assembly according to claim 31 wherein said body and said flexible strap are integrally formed as a monolithic unit.

33. A mezzanine card assembly according to claim 31 wherein said mezzanine card heat sink comprises copper.

34. A mezzanine card assembly according to claim 31 further comprising an electrical connector portion carried by said mezzanine circuit card for mating with the host circuit card assembly.

35. A mezzanine card assembly according to claim 31 further comprising a plurality of support posts extending outwardly from said mezzanine circuit card to engage the host card assembly.

36. A mezzanine card assembly according to claim 31 wherein said mezzanine circuit card comprises a peripheral component interface (PCI) card.

37. A mezzanine card assembly according to claim 31 wherein said mezzanine card is configured to conform to at least one of the IEEE Standard for a Common Mezzanine Card (CMC) Family and the Conduction Cooled PCI Mezzanine Card (CCPMC) Draft Standard, VITA 20-200x standards.

38. A method for conduction cooling of a mezzanine circuit card assembly comprising:
  mounting the mezzanine circuit card assembly to a host circuit card assembly in spaced relation therefrom, the mezzanine card assembly comprising a mezzanine card heat sink and a mezzanine circuit card connected to the mezzanine card heat sink, the mezzanine card heat sink comprising a body adjacent the mezzanine circuit card, and a strap extending outwardly from the body; and
  connecting the strap of the mezzanine card heat sink to a card chassis receiving the host circuit card assembly.

39. A method according to claim 38 wherein the strap is flexible.

40. A method according to claim 38 wherein the body and the flexible strap are integrally formed as a monolithic unit.

41. A method according to claim 38 wherein the host card assembly comprises a host card heat sink having an end, and a host circuit card mounted on the host card heat sink; and further comprising connecting the end of the host card heat sink to the card chassis together with the end of the strap of the mezzanine card heat sink.

42. A method according to claim 38 wherein the host card assembly comprises a host card heat sink having an end, and a host circuit card mounted on the host card heat sink; and further comprising connecting the end of the host card heat sink to the card chassis in spaced relation from the end of the strap of the mezzanine card heat sink.

43. A method according to claim 38 wherein the mezzanine circuit card comprises a peripheral component interface (PCI) card.

44. A method according to claim 38 wherein the mezzanine card assembly is configured to conform to at least one of the IEEE Standard for a Common Mezzanine Card (CMC) Family and the Conduction Cooled PCI Mezzanine Card (CCPMC) Draft Standard, VITA 20-200x standards.

* * * * *